United States Patent [19]

Wallace

[11] 4,130,810
[45] Dec. 19, 1978

[54] SOLID STATE POWER COMBINER

[75] Inventor: Ronald M. Wallace, Braintree, Mass.

[73] Assignee: Raytheon Company, Lexington, Mass.

[21] Appl. No.: 814,744

[22] Filed: Jun. 30, 1977

[51] Int. Cl.² .................................................. H03B 7/06
[52] U.S. Cl. ........................................ 331/107 R; 331/56
[58] Field of Search ................................ 331/56, 107 R

[56] References Cited

U.S. PATENT DOCUMENTS 3,612,914  10/1971  Evans ........................... 331/107 R

OTHER PUBLICATIONS

Microwaves, Mar., 1971, Davis, pp. 9, 10.

Primary Examiner—John Kominski
Attorney, Agent, or Firm—Philip J. McFarland; Joseph D. Pannone

[57] ABSTRACT

An improved solid state transmitter (and elements therefor) adapted particularly well to pulsed operation at radio frequencies is disclosed. Such transmitter includes the combination of: A crystal-controlled oscillator producing a continuous wave output signal which, ultimately, determines the frequency of each transmitted pulse; a first oscillatory circuit, including a resonant cavity and at least one normally quiescent coaxial oscillator incorporating an IMPATT diode; a second oscillatory circuit, including a resonant cavity and a plurality of normally quiescent coaxial oscillators, each one of such oscillators incorporating an IMPATT diode; and an improved modulator for periodically actuating all of the IMPATT diodes in such a manner that a pulsed output of the first oscillatory circuit is produced which remains locked to the then existing continuous wave signal out of the crystal-controlled oscillator and the pulsed outputs of the coaxial oscillators in the second oscillatory circuit similarly are locked.

The improved elements disclosed, in addition to the improved modulator, include various configurations of coaxial oscillators which are easier to align than known oscillators of such type or which allow a greater number of such oscillators to be coupled to a resonant cavity than was possible according to the prior art. Finally, an improved probe and tuning arrangement for a resonant cavity is disclosed.

1 Claim, 7 Drawing Figures

SOLID STATE POWER COMBINER

BACKGROUND OF THE INVENTION

This invention pertains generally to radio frequency oscillators and particularly to oscillators of such type which are adapted to combine the power out of a plurality of solid state devices.

It has been known for many years that radio frequency signals out of each one of a plurality of oscillatory circuits may, in effect, be added in so-called "combiner" circuits to produce a single radio frequency signal of high amplitude. With the development of solid state devices, such as IMPATT diodes, as the active elements in oscillatory circuits, the interest in combiner circuits has increased. The average and peak power levels of these devices are high enough so that useful transmitter power levels can be achieved by combining a practical number of devices in a suitable combiner circuit. Exemplary combiner circuits using solid state devices are shown in U.S. Pat. Nos. 3,628,171 (Kurokawa et al.) and 3,931,587 (Harp et al.).

Both of the just-cited patents show combiner circuits with a plurality of IMPATT diodes operated as continuous wave (CW) oscillators, each one of such diodes being in an oscillatory circuit which is coupled to a common cavity. The requisite frequency and phase relationship between the radio frequency oscillations of the different CW oscillators is determined in operation by the characteristics of the common cavity.

Although either of the combiner circuits shown by Kurokawa et al. and Harp et al. is satisfactory in its "steady state" condition, i.e. when producing CW oscillations, a somewhat different situation obtains when either is used to produce pulses of radio frequency energy. Pulsed design can be optimized for simultaneously achieving stability of operation, combining efficiency and spectral purity.

Another problem with pulsed IMPATT diode oscillators, not addressed in either of the cited patents, is that such devices require, for best operation, an electrical power supply which is effectively current-regulated in a particular manner. Specifically, the electrical power supply must, if the spectral purity of each pulse is to be maintained, be adapted to compensate for an increase in the temperature of the junction of the IMPATT diode during the generation of each pulse. In addition, when pulsed operation is desired, the rise and fall times of each pulse should be controllable to allow the spectrum of each radio frequency pulse to be shaped as desired.

SUMMARY OF THE INVENTION

It has been suggested by Kurokawa et al. that a combiner circuit may be made with a common rectangular cavity operating in a mode other than the $TE_{01N}$ mode, where N is an integer corresponding to half the number of combined devices. The specific example given by Kurokawa et al. is a common rectangular cavity operating in the $TE_{02N}$ mode. Kurokawa et al. also suggest that conventional mode suppressors may be used when the common cavity is dimensioned to support the $TE_{02N}$ (or higher) mode. The common cylindrical cavity shown by Harp et al. is operated in the $TM_{010}$ mode, although, presumably, mode suppressors could be incorporated to allow higher modes, e.g. the $TM_{020}$ mode, to be supported. In any event, because of the fact that the longitudinal axes of the diode oscillators and the cavity shown by Harp et al. are parallel to each other, the maximum number of diode oscillators which may be coupled to a common cylindrical cavity with a given circumference is determined by the ratio of that dimension to the outside diameter of a diode oscillator. Such a limitation on the maximum number of diode oscillators in turn places an unwanted upper limit on the amount of radio frequency energy which may be combined.

Therefore, it is a primary object of this invention to provide an improved "solid state" transmitter utilizing pulsed IMPATT diodes (or other such devices) whose power is combined in a combiner circuit.

Another object of this invention is to provide an improved combiner circuit for IMPATT diodes wherein the frequency at which such diodes operate is determined by an "injection lock" technique whereby such frequency is controlled by a crystal oscillator.

Another object of this invention is to provide an improved combiner circuit for IMPATT diodes wherein the number of such diodes may be at least double the number of IMPATT diodes arranged according to the prior art.

Still another object of this invention is to provide an improved combiner circuit for IMPATT diodes wherein such diodes are biased during pulse operation in such a manner that the frequency of operation is substantially unaffected by change in the temperature of the junctions of such diodes.

The foregoing and other objects of this invention are generally attained by providing, in a solid state transmitter, a combiner circuit using a plurality of pulsed diode oscillators coupled to a cylindrical cavity, the radio frequency energy in such cavity being injection locked during each pulse to the radio frequency energy out of a crystal controlled oscillator (which is operated continuously). The pulses of radio frequency energy out of the pulsed diode oscillators are periodically produced by applying direct current signals to an IMPATT diode in each pulsed diode oscillator, such signals being derived from modulators which are adapted appropriately to bias the IMPATT diodes. The invention also encompasses alternative combiner circuits wherein the number of pulsed diode oscillator circuits may be maximized.

BRIEF DESCRIPTION OF THE DRAWINGS

For a more complete understanding of this invention, reference is now made to the following description of embodiments of this invention illustrated in the accompanying drawings, wherein.

DESCRIPTION OF THE PREFERRED EMBODIMENT

Figure 1:
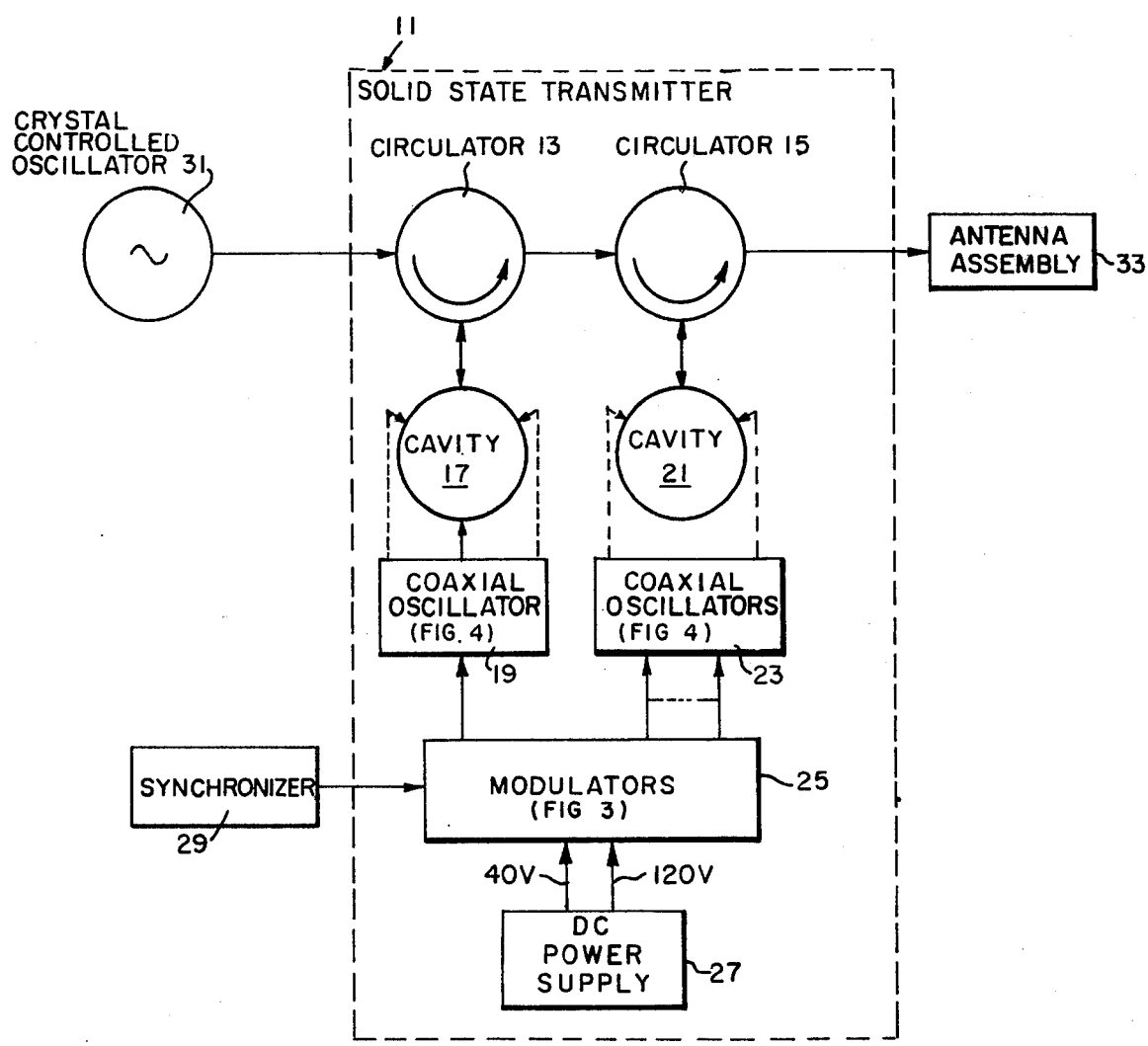
FIG. 1 is a block diagram, somewhat simplified, of a solid state transmitter in accordance with the concepts of this invention.

Referring now to FIG. 1, it may be seen that a solid state transmitter 11 according to this invention comprises two stages (not numbered), each stage being associated generally with one of a pair of circulators 13, 15 of conventional construction. The first, or low power stage, associated with the circulator 13, comprises a cavity 17 to which a coaxial oscillator 19 is magnetically coupled (as indicated by the broken lines). The second, or high power output stage associated with the circulator 15, comprises a cavity 21 to which each one of a plurality (here nine in number) of coaxial oscillators 23 is magnetically coupled (as indicated by the broken lines). The coaxial oscillator 19 and the coaxial oscillators 23 (shown in detail in FIG. 2) are actuated by output signals from modulators 25 which, in turn, are effective to apply biasing voltages from a D.C. power supply 27 to the coaxial oscillator 19 and the coaxial oscillators 23 whenever actuating signals from a synchronizer 29 are applied.

Cavities 17 and 21 here are cylindrical cavities illustrated in more detail hereinafter. Suffice it to say here that such cavities preferably are dimensioned to support the $TM_{010}$ mode of oscillation at the radio frequency to be propagated. Further, such cavities are proportioned to have a optimum Q and their inner walls are coated with a high conductivity material and/or polished to reduce ohmic losses.

To complete the illustrated transmitter, a crystal controlled oscillator 31 is connected as shown to the circulator 13 and an antenna assembly 33 is connected as shown to the circulator 15. The crystal oscillator 31 may be of any conventional construction to produce continuous oscillations at the frequencies within the locking bandwidths of cavities 17 and 21. The antenna assembly 33 also may be of conventional construction. However, it is preferred that the antenna assembly 33 be a monopulse array antenna with the output of the circulator 15 being connected through isolator means (not shown) to the sum port of the arithmetic unit (not shown) of such an array antenna. The difference ports of the arithmetic unit would then be connected to the difference channels of a monopulse receiver (not shown) and the proper port of the isolating means would be connected to the sum channel of such receiver.

It wil now be recognized that, in operation, the output of the crystal oscillator 31 is continuously applied, through the circulator 13, to the cavity 17. Oscillations at the frequency of the crystal controlled oscillator 31 are, therefore, continuously induced in the cavity 17. It follows, then, that whenever the coaxial oscillator 19 is pulsed, the resulting pulsed oscillations are locked to those produced by crystal controlled oscillator 31. That is to say, the center line of the pulsed spectrum of coaxial oscillator 19 is locked to the frequency determined by the crystal controlled oscillator 31. The output of the cavity 17 is passed through the circulators 13, 15 to the cavity 21. Coaxial oscillators 23, in turn, are forced to resonate in phase with each other at the resonant frequency of the cavity 21. The powers of the coaxial oscillators 23 are, therefore, combined in the cavity 21. When the pulsed oscillations from cavity 17 are present the high power spectrum from cavity 21 aligns itself with the spectrum of such oscillations. The pulsed oscillations out of cavity 21 are then an approximate amplified replica of the pulsed oscillations out of cavity 17.

It will be obvious to one of skill in the art that the resonant frequencies of the cavities 17, 21 used in the solid state transmitter 11 should, for best operation, be the same as the frequency of the output of the crystal controlled oscillator 31. Further, it will be obvious that any misalignment experienced in any practical case must be less than the locking bandwidths of the combinations of the cavity 17 with the coaxial oscillator 19 and the cavity 21 with the coaxial oscillators 23. Locking bandwidth is inversely proportional to the locking gain. For the typical gains (10–15 dB per stage) used in the solid state transmitter 11 the bandwidth of the combination of the cavity 17 with the coaxial oscillator 19 is several tenths of a percent and the combination of the cavity 21 with the coaxial oscillators 23 is under 3 percent.

It will be obvious to one of skill in the art that wide ambient temperature variation and maximum temperature are two factors affecting transmitter design. Upon turn-on, the IMPATT diode junction temperature in each one of the coaxial oscillators 19, 23 rises above ambient by 200° C in a fraction of a second. At junction temperatures above 220° C the IMPATT diode reliability is reduced by approximately one-half for every 10° C increase in temperature. While the foregoing suggest that a temperature control arrangement of some type should be employed, it has been found to be adequate simply to juxtapose cavities 17 and 21 and to provide cooling coils of a conventional type (now shown in FIG. 1) for a coolant (such as water) to dissipate the heat generated at the junctions of the IMPATT dioes in diodes coaxial oscillators 19, 23.

Figure 2:
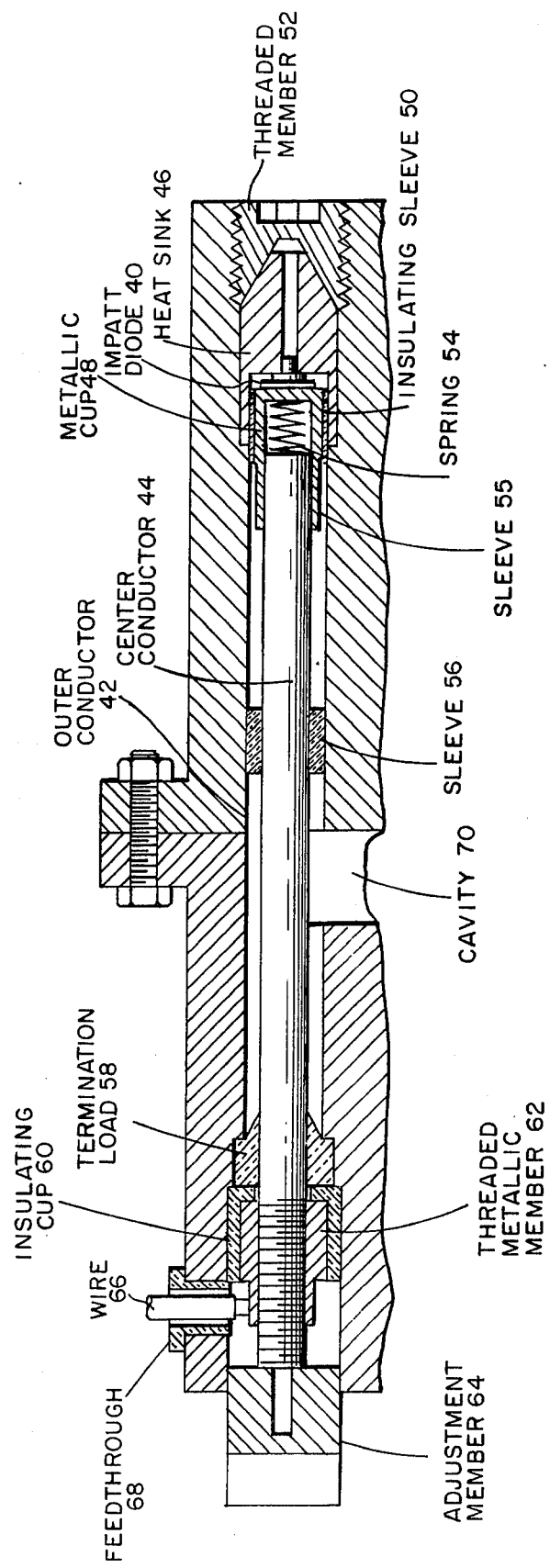
FIG. 2 is a cross-sectional view of an exemplary one of the diode oscillators used in the transmitter shown in FIG. 1.

Referring now to FIG. 2, it may be seen that each one of the coaxial oscillators 19, 23 of FIG. 1 comprises an IMPATT diode 40 mounted in a section of coaxial line (not numbered). Each such line is here fabricated by forming a substantially cylindrical opening in a block (not numbered) of aluminum to make an outer conductor 42 with a center conductor 44 supported therein in a manner to be described. The IMPATT diode 40 is mounted between a heat sink 46 (which is supported by the outer conductor 42, as shown) and a metallic cup 48 slidably supported on the center conductor 44. The IMPATT diode 40 preferably is maintained in position by bonding with a conducting epoxy in a depression (not shown) in the metallic cup 48, and by soldering in an opening (not numbered) in the heat sink 46.

An insulating sleeve 50 is disposed, as shown, to isolate the metallic cup 48 from the outer conductor 42 and the heat sink 46. The latter is held in place by a threaded member 52. A spring 54 is disposed between the metallic cup 48 and the center conductor 44. A first impedance transformer (not numbered) here made up of the metallic cup 48, the insulating sleeve 50 and a sleeve 55 (here made of beryllium copper), is disposed as shown adjacent to the IMPATT diode 40. A second impedance transformer (not numbered), here comprising a sleeve 56 of any appropriate dielectric material bonded to the center conductor 44 and slidably disposed within the outer conductor 42, is also emplaced as shown. The purpose of the two impedance transformers will be discussed in more detail hereinafter. A termination load 58, here tapered and positioned as shown against a conforming shoulder (not numbered) in the outer conductor 42, is slidably mounted on the center conductor 44. The termination load 58 is held in place against the conforming shoulder by an insulating cup 60, such cup being forced against the termination load 58 by a threaded metallic member 62. The material of the termination load 58 here is the material known as "ECCOSORB", (a trademark of Emerson & Cuming, Incorporated, Microwave Products Division, Canton, Mass.). The threads on the threaded metallic member 62 are such as to mate with a corresponding threaded portion (not numbered) on the center conductor 44. An insulating adjustment member 64 is placed on a formed end (not numbered) of the center conductor 44. Finally, a bias wire 66 is supported in a feedthrough 68 (here any conveniently formed insulating material) passing, as shown, through the outer conductor 42. The inner end of the bias wire 66 is connected in any convenient fashion (as by soldering) to the threaded metallic member 62. Finally, the outer conductor 42 is opened into a cavity 70.

It may be seen from the foregoing description that: (a) if the bias wire 66 is connected to a source of electrical power (as one of the modulators 25 of FIG. 1), a voltage may be applied, through the threaded metallic member 62, the center conductor 44, the spring 54 and the metallic cup 48 to one electrode of the IMPATT diode 40; and (b) the distance between the sleeve 56 and the sleeve 55 may be changed by rotation of the insulating adjustment member 64.

The voltage applied in this case through the bias wire 66 ultimately to the IMPATT diode 40 is derived from one of the modulators 25 (FIG. 1) in a manner to be described hereinafter. Suffice it to say here that that element is arranged to produce: (a) a pedestal voltage (meaning a constant D.C. voltage) to bias the IMPATT diode 40 at a level somewhat below the level required for avalanche breakdown; and (b) at a selected pulse repetition frequency, voltage pulses which are added to the pedestal voltage, thereby periodically to raise the level of the bias across the IMPATT diode 40 to a level higher than the level at which avalanche breakdown occurs. Typically, with an IMPATT diode such as that designated "Part No. 5082-0710" (an X-band double drift IMPATT diode) by the Hewlett Packard Company of Palo Alto, Calif., the pedestal voltage is in the order of 125 V. (D.C.) and the pulses in the order of 25 V. for 100 to 1,000 nanoseconds with a duty cycle of 30%. The current drawn from the modulator 25 (FIG. 1) is controlled to compensate for the frequency change in the output of an IMPATT diode due to heating of its junction during each pulse. Thus, in the present case (where the level of the radio frequency power out of a combiner circuit using nine coaxial oscillators is to be in the order of 100 watts with a minimum of frequency chirp) the current in each pulse to each one of the coaxial oscillators is increased (as described in connection with FIG. 3) as each voltage pulse is applied to the pedestal voltage. Finally, because the spectral purity of the radio frequency signal out of any pulsed oscillatory circuit is influenced by the shape of the leading and trailing edges of the modulating signals in such a circuit, the modulators 25 (FIG. 1) are arranged to provide (as described in connection with FIG. 3) pulses with leading and trailing edges which have adjustable rise and fall times.

The purpose of the first and the second impedance transformers is to match, at the desired frequency of operation, the relatively low impedance of the IMPATT diode 40 during each pulse to the relatively high impedance of the cavity 70. The principles underlying the way in which such impedance matching may be effected are clearly shown in an article entitled "The Single Cavity Multiple Device Oscillator" by Kaneyuki Kurokawa appearing in the IEEE Transactions on Microwave Theory and Techniques, Volume MTT-19, No. 10, October 1971. The gist of the article just cited is that, assuming a "well-defined" admittance of each IMPATT diode, the parameters of a single stage impedance transformer may be defined to meet the necessary conditions for oscillations, which include the following: (i) providing a load equal to the negative of the diode impedance at the desired operating frequency; (ii) presenting a proper phase angle between the load and diode impedance characteristics; and (iii) preventing oscillation at undesired frequencies. While the approach taken in the just-cited article makes it possible to design a working combiner circuit using a cavity to combine the outputs of a plurality of coaxial oscillators, such a design is difficult to implement in practice.

The use of only a single stage impedance transformer (which inherently is a narrow band device) makes it difficult to simultaneously satisfy all of the criteria necessary for successful operation because of its limited flexibility. The difficulty is compounded when a plurality of IMPATT diodes is operated in 9 pulses mode in a plurality of coaxial oscillators. That is to say, when (as here) power from each one of a plurality of IMPATT diodes (each having different admittances varying in a nonlinear fashion with RF power and DC bias current) is to be combined periodically, it is almost impossible to avoid conditions which result in unsatisfactory operation.

In order to provide additional tuning means which may be manipulated to satisfy Kurokawa's criteria for oscillation and to allow for individual diode tuning adjustments, a cascaded set of coaxial transformers, including one moveable transformer, is used in each diode line.

It will be remembered that the IMPATT diode 40 and the first impedance transformer are parts of a unitary subassembly when emplaced in the coaxial oscillator. It will also be remembered that the position of the second impedance transformer relative to the first transformer is adjustable. With such an arrangement, even though a deviation in the actual impedance of the IMPATT diode from its nominal value may induce a corresponding change in the impedance at the output of the first impedance transformer, compensation may be accomplished by adjusting the position of the second impedance transformer relative to the first impedance transformer. Such adjustment, of course, is effective to change the input impedance to the second impedance transformer, thereby finally to cause the proper match between the output impedance of that transformer and the input impedance of the cavity 70. It will be noted here that the adjustment of the position of the second impedance transformer relative to the first impedance transformer is accomplished simply by rotation of the adjustment member 64. This means that there is no opening required in the outer conductor 42 for access to the sleeve 56. Such an opening would, of course, constitute a discontinuity to perturb the electrical field inside the coaxial oscillator.

Figure 3:
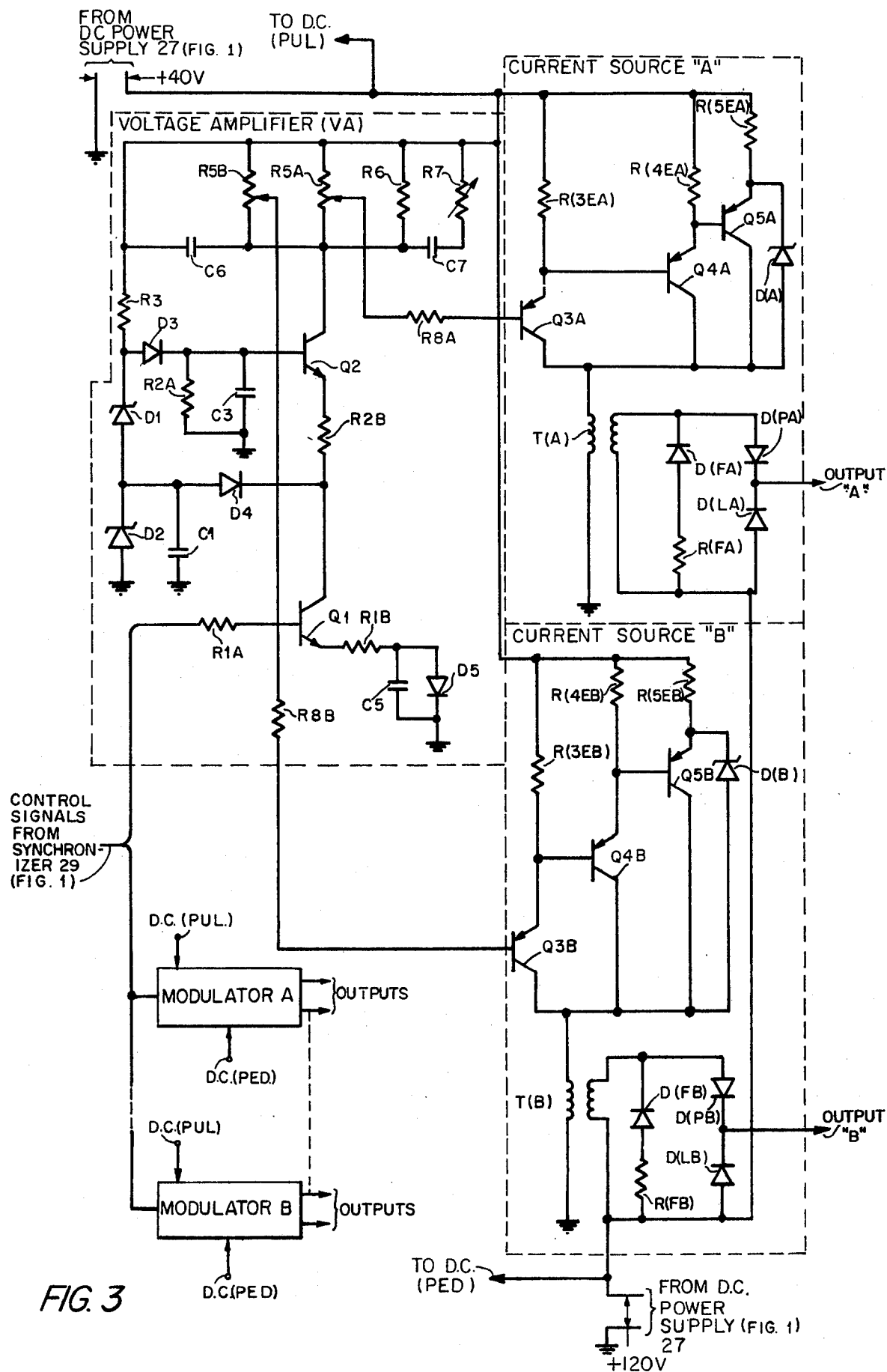
FIG. 3 is a schematic diagram of an exemplary one of the modulators used in the transmitter shown in FIG. 1.

Referring now to FIG. 3, it may be seen that an exemplary one of the modulators 25 (FIG. 1) comprises a voltage amplifier (VA) which, in response to control pulses from the synchronizer 29 (FIG. 1), drives a current source "A" and a current source "B". The voltage amplifier VA is a temperature compensated cascaded amplifier having two transistors, Q1 and Q2, as the active elements therein (here, respectively, a type 2N3866 and a type 2N2222A). The control pulses (which here typically are in the order of 800 nanoseconds in length at repetition frequencies between 362 KHz and 435 KHz) are passed to the base of the transistor Q1 through a coupling resistor R1A. The emitter of the transistor Q1 is connected through a biasing resistor R1B and the parallel combination of a capacitor C5 and a diode D5 to ground. The diode D5 here is a type IN3611 diode to allow the desired temperature compensation to be effected. The collector of the transistor Q1 is connected through a coupling resistor R2B to the emitter of the transistor Q2. The base of the transistor Q2 is connected to a diode D3 (here a type IN4148 diode) and a dropping resistor R3 to a 40 volt tap (not shown) in the D.C. power supply 27 (FIG. 1). The junction of the diode D3 and the resistor R3 is connected through zener diodes D1 and D2 to ground. The diodes D1 and D2 here are type IN751A zener diodes. A bypass capacitor C1 is connected across the diode D2. The junction of the diodes D1 and D2 is also connected through a switching diode D4 to the junction between the collector of the transistor Q1 and the coupling resistor R2B. In addition, a parallel combination of a resistor R2A and a capacitor C3 is connected from the junction of the diode D3 and the base of the transistor Q2 to ground. The collector of the transistor Q2 is connected to the parallel combination of potentiometers R5A, R5B and resistor R6 back to the 40 volt tap on the D.C. power supply 27 (FIG. 1). The collector of the transistor Q2 is also connected as shown to a capacitor C6 and the serial combination of a capacitor C7 and a potentiometer R7 back to the 40 volt tap on the D.C. power supply 27 (FIG. 1). The taps on the potentiometers R5A and R5B are connected, respectively as shown, through resistors R8A and R8B to current source "A" and current source "B". Because such current sources are identical in construction only one will be described. Thus, the second lead of the resistor R8A is connected to the base of a transistor Q3A, here a type 2N3468 transistor. The emitter of the transistor Q3A is connected through a dropping resistor R(3EA) to the 40 volt tap in the D.C. power supply 27 (FIG. 1) and directly to the base of a transistor Q4A. The latter here is a type 2N5161 transistor. The emitter of the transistor Q4A is connected through a dropping resistor R(4EA) to the 40 volt tap of D.C. power supply 27 (FIG. 1) and directly to the base of a transistor Q5A, here a type 2N5162 transistor. The emitter of the transistor Q5A is connected through a dropping resistor R(5EA) to the 40 volt tap of the D.C. power supply 27 (FIG. 1) and to a zener diode D(A) poled as shown. The latter here is a type 1N4757 zener diode. The collectors of the transistors Q3A, Q4A, Q5A and the second electrode of the zener diode D(A) are connected together as shown to an input terminal of a pulse transformer T(A) having a 1:1 turns ratio. The second input terminal of the pulse transformer T(A) is connected to ground. A serial combination of a resistor R(FA) and a diode D(FA) is connected across the secondary terminals of the pulse transformer T(A) along with oppositely polarized diodes D(PA) and D(LA). The just mentioned diodes all are type 1N4454 diodes. The junction of the resistor R(FA) and the diode D(LA) is connected to a tap (not shown) on the D.C. power supply 27 (FIG. 1) hereinafter referred to as the 120 volt tap. Finally, the output of the current source "A" (labelled output "A") is taken at the junction between the diodes D(PA) and D(LA).

Before an explanation of the just described circuit is undertaken it will be appreciated that some simplification has been made. In particular, fuzes to protect the current source "A" and current source "B", arrangements for testing and parallel combinations of elements have been omitted.

The signal into the transistor Q1 is effective to change the current flow through transistor Q2 in accordance with the setting of the potentiometer R7 which, in turn, controls the time constant of the combination of capacitor C7 and potentiometer R7. Such change in current through the transistor Q2 then is reflected as a change in drive to the base of the transistor Q3A by reason of the setting of the potentiometer R5A. The combination of the transistors Q3A, Q4A and Q5A is in effect similar in operation to a conventional Darlington circuit. The drive to the base of the transistor Q3A determines the current level finally attained by such circuit. The diodes D(PA) and D(LA) constitute a two-way clamp whereby the voltage of output "A" is held at the level of the 120 volt tap in the D.C. power supply 27 (FIG. 1) at all times except when a control pulse from the synchronizer 29 (FIG. 1) is present. The serial combination of the resistor R(FA) and diode D(FA) is effective to quench any transient which may occur at the end of each control pulse from the synchronizer 29 (FIG. 1).

Figure 4:
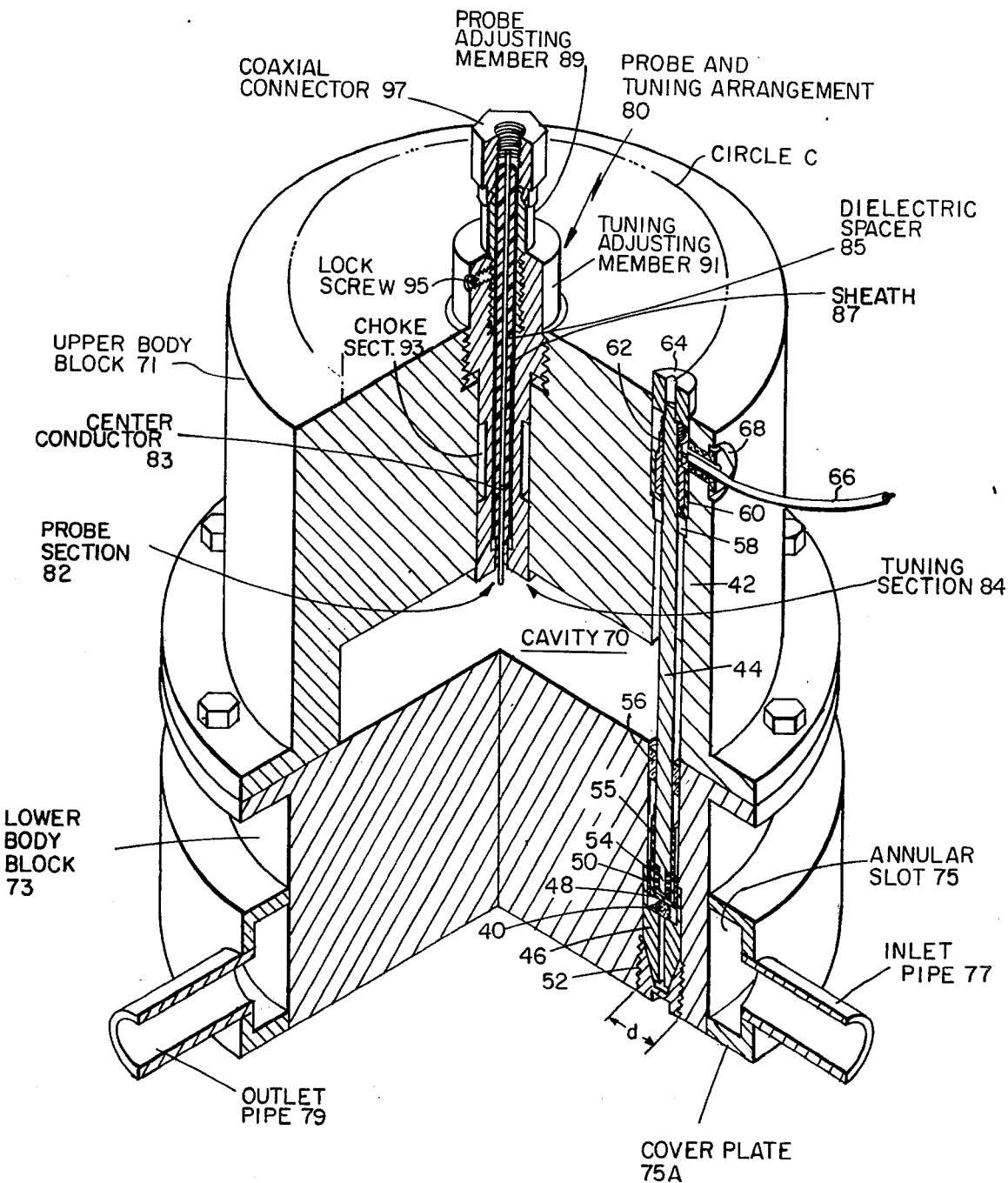
FIG. 4 is a sketch, somewhat simplified, showing the physical relationship between the power combining and coaxial oscillator of FIG. 1.

Referring now to FIG. 4, it will be noted that, because the coaxial oscillator 19 (FIG. 1) is here substantially the same as the coaxial oscillator shown in FIG. 2, a detailed description of the elements making up the coaxial oscillator 19 is not necessary to an understanding of this invention. Further, it will be noted that the cavity 17 (FIG. 1) corresponds with the cavity 70.

With the foregoing in mind, it may be seen that the cavity 70 is here formed by bolting together an upper body block 71 and a lower body block 73 (the two such blocks preferably being flanged as shown and fabricated from aluminum). The lower surface of the cavity 70 is that portion (not numbered) of the lower body block 73 defined by a centrally located counterbore (not numbered) shown in the upper body block 71. In the embodiment of the invention being described, the counterbore in the upper body block 71 is dimensioned to support the TM 010 mode at the frequency of interest. A cylindrical hole (not numbered) parallel to the longitudinal axes of the upper body block 71 and the lower body block 73 is bored through such blocks, the axis of such cylindrical hole intersecting a circle, C. The radius of the circle, C, here is the same as the radius of the counterbore in the upper body block 71. It will be observed that the portions of the upper body block 71 and the lower body block 73 surrounding the cylindrical hole through the upper body block 71 and the lower body block 73 and the surfaces defining the cavity 70 may be highly polished or plated in any convenient manner with a material, such as copper or silver, which is highly conductive to reduce ohmic losses.

The lower body block 73 is extended as shown to provide room for an annular slot 75. A cover plate 75A is then positioned over the open side of the annular slot 75 and secured in any convenient manner. An inlet pipe 77 and an outlet pipe 79 are connected in any convenient fashion as shown to allow a coolant (such as water) to be fed from the pressure side of a pump (not shown) through the annular slot 75 to the suction side of such pump. It will be appreciated by one of skill in the art that the purpose of the illustrated cooling arrangement just described is to remove heat generated within the IMPATT diode 40. In this connection it is here noted that the center conductor 44 and the heat sink 46 are in proximity to the IMPATT diode 40. For this reason, both are made from oxygen-free high conductivity (OFHC) copper. As is known, OFHC copper is particularly well suited to resist thermal cracking.

A probe and tuning arrangement 80 here is positioned along the longitudinal axis of the upper body block 71. Such arrangement here includes a probe section 82 within a tuning section 84, the two sections being mounted to be adjustable (either together or independently) in a manner now to be described.

The probe section 82 comprises a section of conventional coaxial line, i.e. a coaxial line having a center conductor 83, a dielectric spacer 85 and a sheath 87, rotatably and slidably supported on the longitudinal axis of the cavity 70. To effect such support of the probe section 80 (and also to provide a similar type of support for the tuning section 84) a probe adjusting member 89, here a metallic body machined to the shape shown, is threaded into a mating thread in a tuning adjusting member 91. The latter is also a metallic body machined to the shape shown, threaded into a mating thread in the upper body block 71 and journalled in a bearing (not numbered) formed in the upper block 71. It is noted here that a choke section 93 preferably is formed in the tuning adjusting member 91. A lock screw 95 threaded as shown into a mating thread in the tuning adjusting member 91 is positioned as desired either to lock the probe adjusting member 89 and the tuning adjusting member 91 together or to allow those members to be moved independently of each other.

It will be appreciated that the lower end of the center conductor 83 must be electrically insulated from the tuning section 84. Such insulation is provided, as shown, by the lower part of the dielectric spacer 85 which is not removed when the lower part of the sheath 87 is removed. It will also be appreciated that the coaxial line (not numbered) in the probe adjusting member 89 must be connected to a transmission line (not shown) to allow, for example, a locking signal to be injected into the cavity 70 and radio frequency energy to be extracted from the cavity 70. To accomplish this, the upper end of the center conductor 83 is exposed and a conventional coaxial connector 97 is mounted on the probe adjusting member as shown. A conventional double female adapter (not shown) may then be used to complete the requisite connection to a transmission line, terminated with a coaxial connector similar to the coaxial connector 97.

It will now be apparent that the three adjustment points in the just-described locking cavity and locking oscillator arrangement are all accessible from the top. Therefore, in applications where space is at a premium, mounting problems are made less difficult to solve.

It will be appreciated that a plurality of coaxial oscillators similar to that illustrated in FIG. 4 could be disposed about the circumference of the circle, C. The total number of such oscillators is, of course, limited by the ratio of the largest diameter, d, of the coaxial oscillator to the circumference of the circle, C. With coaxial oscillators operating in X-band and a cavity supporting the $TM_{010}$ mode, it has been found that, as indicated in FIG. 1, up to 15 to 16 coaxial resonators may be positioned.

Figure 5A:
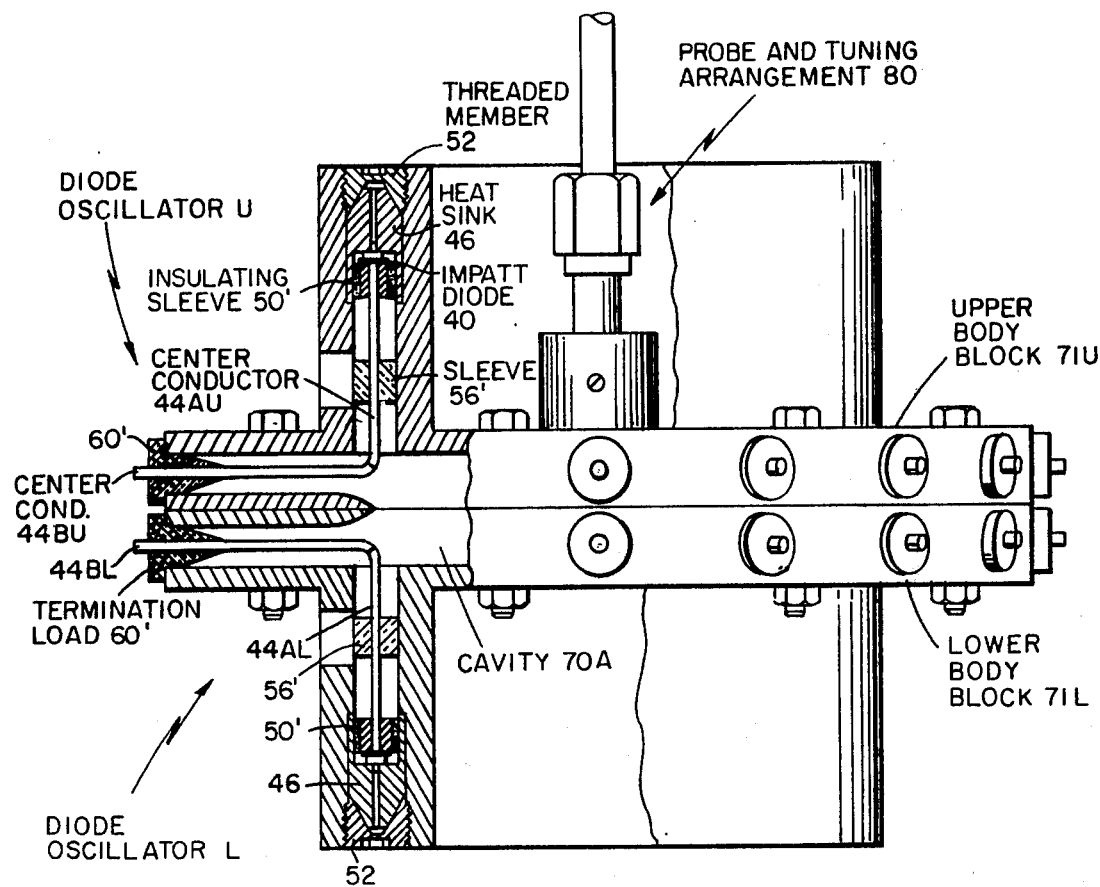
FIGS. 5A, 5B and 5C are sketches showing how the diode oscillator shown in FIGS. 2 and 4 may be modified to increase the number of IMPATT diodes to be used in conjunction with an output cavity such as is shown in FIG. 1.

Referring now to FIG. 5A, it may be seen that a desired increase in the number of diode (or coaxial) oscillators disposed in a coupling relationship about the periphery of a cylindrical cavity is here effected by changing the shape of each diode oscillator and modifying the way in which the cylindrical cavity is formed. Thus, in FIG. 5A it may be seen that the center conductor of each one of a pair of diode oscillators U,L is made up of two orthogonally disposed sections, e.g. center conductor 44AU and center conductor 44BU for diode oscillator U and center conductor 44AL and center conductor 44BL for diode oscillator L, joined in any convenient manner and centrally supported within orthogonally disposed bores (not numbered) in either an upper body block 71U or a lower body block 71L. The bores in which center conductors 44AU and 44AL are supported are parallel to the longitudinal axis of the cavity 70A, and preferably are centered at a common point on the circumference of such cavity. The bores in which the center conductors 44BU and 44BL are mounted are radial to the cavity 70A and are centered, as shown, to intersect, respectively, the bores for the center conductors 44AU and 44AL. The cavity 70A is here formed by forming opposing counterbores in the upper block 71U and the lower block 71L. It will now be apparent that, with the radius of the cavity 70A the same as the radius of the cavity 70 (FIG. 4) and the diameters of the diode oscillators U, L the same as the diameter of the coaxial oscillator shown in FIG. 4, twice the number of such oscillators may be disposed in a coupling relationship with the cavity 70A than with the cavity 70.

Because the center conductors of the diode oscillators being described are bent, the way in which the elements making up each such oscillator are mounted must, perforce, differ from the way in which corresponding elements in the coaxial oscillator described in connection with FIG. 4 are mounted.

With the foregoing in mind, it will be seen that, in diode oscillator U, the center conductor 44BU is simply passed through an appropriately sized hole (not numbered) in a termination load 60'. Such load is shaped as shown and cemented in the radial bore in the upper body block 71U. The free end of the center conductor 44BU then serves the same purpose as the bias wire 66 (FIG. 4).

The center conductor 44AU is passed through a sleeve 56' which is similar in construction and purpose to the sleeve 56 (FIG. 4). In this case, however, a sliding fit is provided between the center conductor 44AU and the sleeve 56'. Also, a slot (not numbered) is formed through the wall of the upper body block 71U adjacent to the sleeve 56'. It may be seen, therefore, that the position of the sleeve 56' along the length of the center conductor 44AU may be adjusted without changing the relative positions of such conductor and the cavity 70A.

A depression (not shown) is formed in the free end of the center conductor 44AU to accommodate one terminal of an IMPATT diode 40. A conducting epoxy then may be used to provide a low resistance contact between the center conductor 44AU and the IMPATT diode 40. The second electrode of the IMPATT diode 40 is connected in the same way as illustrated in FIG. 2, i.e. such second electrode is soldered in an opening (not numbered) in a heat sink 46 which is held in place by a threaded member 52. An insulating sleeve 50' bonded to the heat sink 46 and fitted around the center conductor 44AU completes the illustrated diode oscillator U.

It will be recognized that the insulating sleeve 50', the sleeve 56' and the termination load 60' serve to support the center conductors 44AU, 44BU so that a bias voltage may be applied to the IMPATT diode 40. In addition, the insulating sleeve 50' and the sleeve 56' serve the same function as the two impedance transformers discussed in connection with FIG. 2. In the present case, however, the position of the sleeve 56' is adjusted through the opening in the upper body block 71U rather than by rotation of the adjustment member 64 (FIG. 2).

The diode oscillator L is made in the same way as the diode oscillator U.

Although the bores in which the center conductors 44AU and 44AL are mounted are shown to be colinear, it will be evident that such an arrangement may be modified. That is, the only requirement here is that the bores be parallel to the longitudinal axis of the cavity 70A with their centerlines intersecting a circle so center conductor 44AU may be offset from center conductor 44AL.

Figure 5B:
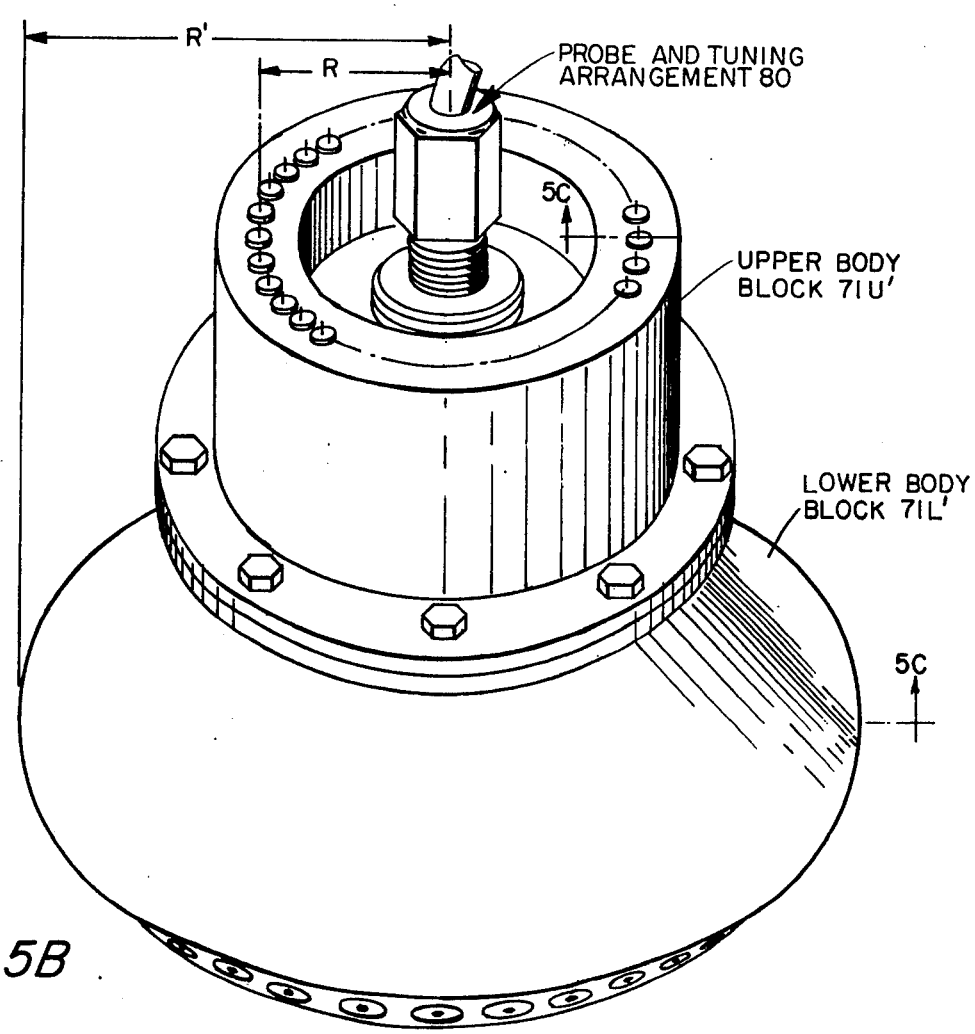
Figure 5C:
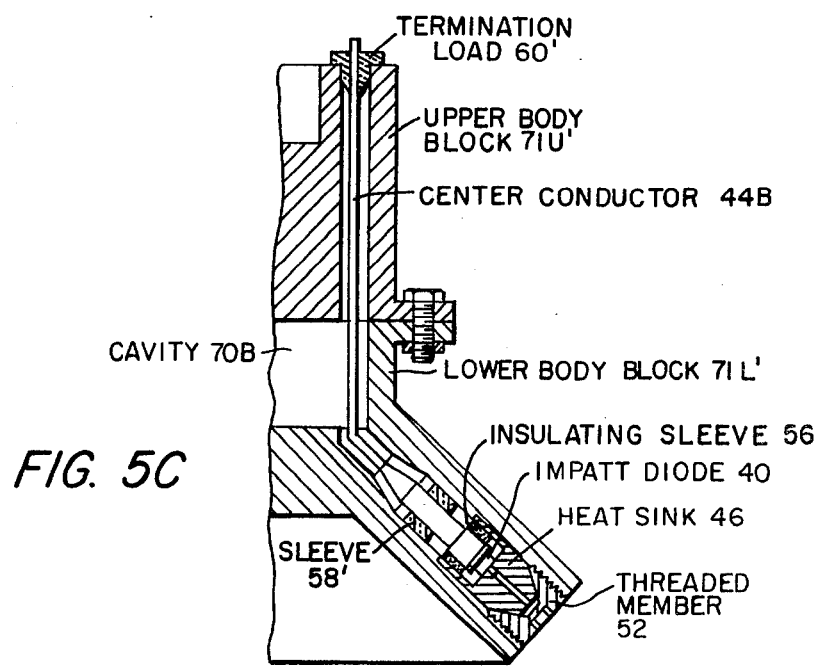

Before referring specifically to FIGS. 5A, 5B and 5C, it will be noted that no cooling arrangement has been shown and that elements in the coaxial oscillators which are the same as the elements illustrated in FIGS. 2 and 4 have been identified by the same numeral as in FIG. 2.

Referring now to FIGS. 5B and 5C, another modification is shown to increase the number of diode oscillators which may be coupled to a cylindrical cavity of a given size. In this case the number of diode oscillators is limited by the ratio of the diameter, d, of each such oscillator to the circumference, $2\pi R'$, of a circle greater than the circumference, $2\pi R$, of the cavity.

To effect the foregoing, advantage is taken of the well known fact that the dimensions (meaning the radii of the inner and outer conductors) of a coaxial line may be changed without affecting the characteristic impedance of such a line. That is, so long as the ratio between the inner radius of the outer conductor and the radius of the inner conductor are constant, the characteristic impedance of a coaxial line is constant. Therefore, it is possible to proportion the radii of the inner and outer conductors of a coaxial line so that one portion of such line (here the portion extending from a termination load past a cavity) is relatively small and a second portion (here the portion including an IMPATT diode) is sized to accommodate such a diode in an oscillatory circuit.

With the foregoing in mind it may be seen in FIGS. 5B and 5C that an upper body block 71U' is machined to support a probe and tuning arrangement 80 (which may be the same as described hereinbefore) and a plurality of bores (not numbered) centered on a circle of radius R and parallel to the longitudinal axis of the upper body block 71U'. Such bores, as indicated, are extended into a lower body block 71L'. The radius of each bore is less than one-half the diameter, d, determined by the diameter of an IMPATT diode 40.

The walls and bottom side of a cavity 70B are formed by a counterbore of radius R in the lower body block 71L'. That block in turn is flared at a convenient angle, say 45°, to its longitudinal axis. A plurality of shaped bores (not numbered) is formed (as shown clearly in FIG. 5C) in the flared portion of the lower body block 71L', each one of such shaped bores intersecting a corresponding one of the plurality of bores through the upper body block 71U' and a portion of the lower body block 71L'. It will now be evident that the surfaces of each shaped bore and its corresponding bore make up the outer conductor of a coaxial line.

The outer portion of each shaped bore is machined to accommodate an IMPATT diode 40 and a first and a second impedance transformer in the same way as described in connection with FIG. 5A.

The inner portion of each shaped bore is the same size as the bore with which it mates. Between the inner and the outer portion of each shaped bore there is a transition comprising a conical frustum.

A center conductor 44B having the cross-sectional shape shown in FIG. 5C is supported in a coupling relationship with the cavity 70B within each pair of bores and shaped bores. The upper end of the center conductor 44B is supported by a termination load 60' and the lower end of the center conductor 44B is supported by the sleeve 58' and the insulating sleeve 56'. The center conductor 44B is shaped so that, at any point along its length, the ratio of its radius to the radius of the shaped bore (or the bore) is constant.

It will now be apparent that, with a given diameter, d, as determined by the IMPATT diode 40 and a cavity 70B of a given circumference, a greater number of diode oscillators may be coupled to the cavity 70B than would be the case if the diode oscillators were configured as shown in FIGS. 2 and 4.

Having described preferred embodiments of this invention, it will now be apparent to one of skill in the art that many changes may be made without departing from the inventive concepts. For example, although only IMPATT diodes have been mentioned as the active elements, the described oscillatory circuits are well adapted to use with other known types of solid state diode oscillating devices. Further, while the crystal controlled locking oscillator shown in FIG. 1 is here a CW device, it is obvious that such an oscillator may be replaced with a pulse oscillator. Also, while the solid state transmitter of FIG. 1 is shown to combine the power from two oscillator stages, it is equally obvious that three or more stages could be combined in like manner. Finally, the positions of the termination loads and IMPATT diodes shown in FIG. 5A could be interchanged. It is felt, therefore, that this invention should not be restricted to its disclosed embodiment, but rather should be limited only by the spirit and scope of the appended claims.

What is claimed is:

1. In a transmitter of radio frequency energy wherein pulses of radio frequency energy are, in response to control signals periodically produced by a synchronizer, generated by an IMPATT diode, a modulator for converting each successive one of the control signals to an actuating signal for the IMPATT diode, such modulator comprising:
   (a) direct current biasing means for continuously applying a direct current signal to the IMPATT diode, the level of such signal being less than the avalanche breakdown level of such diode;
   (b) pulse forming means, responsive to each successive one of the control signals, to produce a corresponding voltage pulse having a level always greater than the difference between the level of the direct current signal to the IMPATT diode and the avalanche breakdown level of such diode, the level of such voltage pulse increasing linearly with time;
   (c) transformer means, responsive to each corresponding voltage pulse out of the pulse forming means, for coupling to the IMPATT diode an analogous current pulse as an actuating signal for such diode, the level of such analogous current pulse increasing substantially linearly with time; and
   (d) clamping means responsive at the end of each actuating signal to maintain the level of the direct current signal applied to the IMPATT diode at a constant value.

* * * * *